US012683585B2

(12) United States Patent
Liao et al.

(10) Patent No.: US 12,683,585 B2
(45) Date of Patent: Jul. 14, 2026

(54) MICROMIRROR RESONANCE SUPRESSION USING CONFIGURABLE FILTER

(71) Applicant: Microsoft Technology Licensing, LLC, Redmond, WA (US)

(72) Inventors: Wenjun Liao, Sunnyvale, CA (US); Algird Michael Gudaitis, Fall City, WA (US); Ruipeng Sun, Pleasanton, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 902 days.

(21) Appl. No.: 17/827,413

(22) Filed: May 27, 2022

(65) Prior Publication Data

US 2023/0384582 A1    Nov. 30, 2023

(51) Int. Cl.
*H03H 21/00*        (2006.01)
*B81B 7/00*         (2006.01)
*G02B 26/08*        (2006.01)

(52) U.S. Cl.
CPC ......... *H03H 21/0021* (2013.01); *B81B 7/008* (2013.01); *G02B 26/0833* (2013.01); *B81B 2201/042* (2013.01)

(58) Field of Classification Search
CPC ............... G02B 26/0833; B81B 7/008; B81B 2201/042; H03H 21/0021
See application file for complete search history.

(56) References Cited

U.S. PATENT DOCUMENTS

| | | | | |
|---|---|---|---|---|
| 5,331,299 A * | 7/1994 | Smith | .................... | H03H 11/04 |
| | | | | 333/17.1 |
| 5,960,091 A * | 9/1999 | White | ................ | H03H 17/0288 |
| | | | | 381/98 |
| 8,059,322 B1 * | 11/2011 | Brown | ............... | G02B 26/0833 |
| | | | | 359/199.1 |
| 8,392,000 B2 * | 3/2013 | Levin | ............... | G05B 19/41835 |
| | | | | 455/73 |
| 8,737,010 B2 * | 5/2014 | Uchida | ............. | G11B 5/59622 |
| | | | | 360/77.02 |
| 8,810,331 B2 * | 8/2014 | Gu | ......................... | H04B 1/525 |
| | | | | 333/17.1 |
| 9,946,062 B1 * | 4/2018 | Tauscher | ............... | B81B 3/0072 |

(Continued)

OTHER PUBLICATIONS

"International Search Report and Written Opinion Issued in PCT Application No. PCT/US23/018763", Mailed Date: Aug. 1, 2023, 10 Pages.

*Primary Examiner* — Thomas A Hollweg
*Assistant Examiner* — Marc E Manheim
(74) *Attorney, Agent, or Firm* — Workman Nydegger

(57) ABSTRACT

The configuring of a micromirror to suppress a resonance of the micromirror. As part of the configuring process, the micromirror is subjected to multiple actuation frequencies, and the micromirror response is measured in response to at least some of these actuation frequencies. A resonant frequency of the micromirror is then determined using at least some of the measured mechanical responses. Then, depending on this determined resonant frequency of the micromirror, notch filter parameters are selected. There is more than one possibility for notch filter parameters, where the selected possibility depends on the determined resonant frequency. The notch filter is then configured with the selected notch filter parameters.

20 Claims, 8 Drawing Sheets

(56)                    References Cited

U.S. PATENT DOCUMENTS

| 11,163,153 | B1 | 11/2021 | Pu et al. | |
| 2014/0168738 | A1 | 6/2014 | Ko | |
| 2019/0310467 | A1* | 10/2019 | Resler | H04N 9/3194 |
| 2021/0396713 | A1* | 12/2021 | Almeida | G01S 7/4817 |

* cited by examiner

<u>400</u>

MICROMIRROR RESONANCE SUPRESSION USING CONFIGURABLE FILTER

BACKGROUND

A Micro-ElectroMechanical System (or MEMS) device is a miniature machine that has both mechanical and electrical components. One category of MEMS device is a device which has a functionality defined by its mechanical movement, but which is actuated using an electrical signal. As an example, a micromirror is caused to move in response to an electrical signal. Such movement may be in the form of tilting to thereby direct reflected light.

An example practical application of an optical system that uses micromirrors is a laser beam scanning display. In such a system, there are often two micromirrors, a fast scan mirror that controls horizontal position of the beam on the display, and a slow scan mirror that controls vertical position of the beam on the display.

Mechanical systems (including MEMS micromirrors) have mechanical resonant frequencies that depend on the geometry of the mechanical system. Depending on the function of the mechanical system and the frequency of the resonance, such resonance has the potential to interfere with proper functioning of the mechanical system.

The subject matter claimed herein is not limited to embodiments that solve any disadvantages or that operate only in environments such as those described above. Rather, this background is only provided to illustrate one exemplary technology area where some embodiments describe herein may be practiced.

BRIEF SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

A micromirror may have multiple resonant frequencies, some more easily dealt with than others. However, there can sometimes be particular resonant frequencies of concern due to its impact on the functionality of the micromirror, and because of deviation of the resonant frequency from device to device, and even within a single device based on aging or temperature changes. In one embodiment, this is the third resonant frequency of the micromirror, but the particular resonant frequency of concern may differ depending on the geometry and function of the micromirror.

At least some embodiments described herein relate to the configuring of a micromirror to suppress a resonance of the micromirror. As part of the configuring process, the micromirror is subjected to multiple actuation frequencies, and the micromirror response is measured in response to at least some of these actuation frequencies. A resonant frequency of the micromirror is then determined using at least some of the measured mechanical responses. Then, depending on this determined resonant frequency of the micromirror, notch filter parameters are selected. There is more than one possibility for notch filter parameters depending on the determined resonant frequency. The notch filter is then configured with the selected notch filter parameters.

Because the notch filter is configured to the actual measured resonant frequency of concern of the micromirror, the notch filter need not be wide enough to handle all possibilities for this resonant frequency. Thus, the frequency range suppressed by the notch filter may have a narrower frequency range. This is beneficial as wider notch filter ranges can introduce actuation response delay, thereby itself adversely impacting performance of the optical system that incorporates the micromirror. However, the narrower notch filter is sufficient since it is in response to actual measured micromirror resonance, thereby taking out at least resonance deviation from device to device.

Furthermore, runtime deviations such as aging and temperature may also be addressed by repeatedly performing the configuring at appropriate intervals considering anticipated rate of resonance changes due to aging and temperature changes. Thus, performance of the micromirror is improved from device to device, and potentially as the device ages and is subject to temperature change.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and details through the use of the accompanying drawings in which.

DETAILED DESCRIPTION

A micromirror may have multiple resonant frequencies, some more easily dealt with than others. However, there can sometimes be particular resonant frequencies of concern due to its impact on the functionality of the micromirror, and because of deviation of the resonant frequency from device to device, and even within a single device based on aging or temperature changes. In one embodiment, this is the third resonant frequency of the micromirror, but the particular resonant frequency of concern may differ depending on the geometry and function of the micromirror.

At least some embodiments described herein relate to the configuring of a micromirror to suppress a resonance of the micromirror. As part of the configuring process, the micromirror is subjected to multiple actuation frequencies, and the micromirror response is measured in response to at least some of these actuation frequencies. A resonant frequency of the micromirror is then determined using at least some of the measured mechanical responses. Then, depending on this determined resonant frequency of the micromirror, notch filter parameters are selected. There is more than one possibility for notch filter parameters depending on the determined resonant frequency. The notch filter is then configured with the selected notch filter parameters.

Because the notch filter is configured to the actual measured resonant frequency of concern of the micromirror, the notch filter need not be wide enough to handle all possibilities for this resonant frequency. Thus, the frequency range suppressed by the notch filter may have a narrower frequency range. This is beneficial as wider notch filter ranges can introduce actuation response delay, thereby itself adversely impacting performance of the optical system that incorporates the micromirror. However, the narrower notch filter is sufficient since it is in response to actual measured micromirror resonance, thereby taking out at least resonance deviation from device to device.

Furthermore, runtime deviations such as aging and temperature may also be addressed by repeatedly performing the configuring at appropriate intervals considering anticipated rate of resonance changes due to aging and temperature changes. Thus, performance of the micromirror is improved from device to device, and potentially as the device ages and is subject to temperature change.

Figure 1:
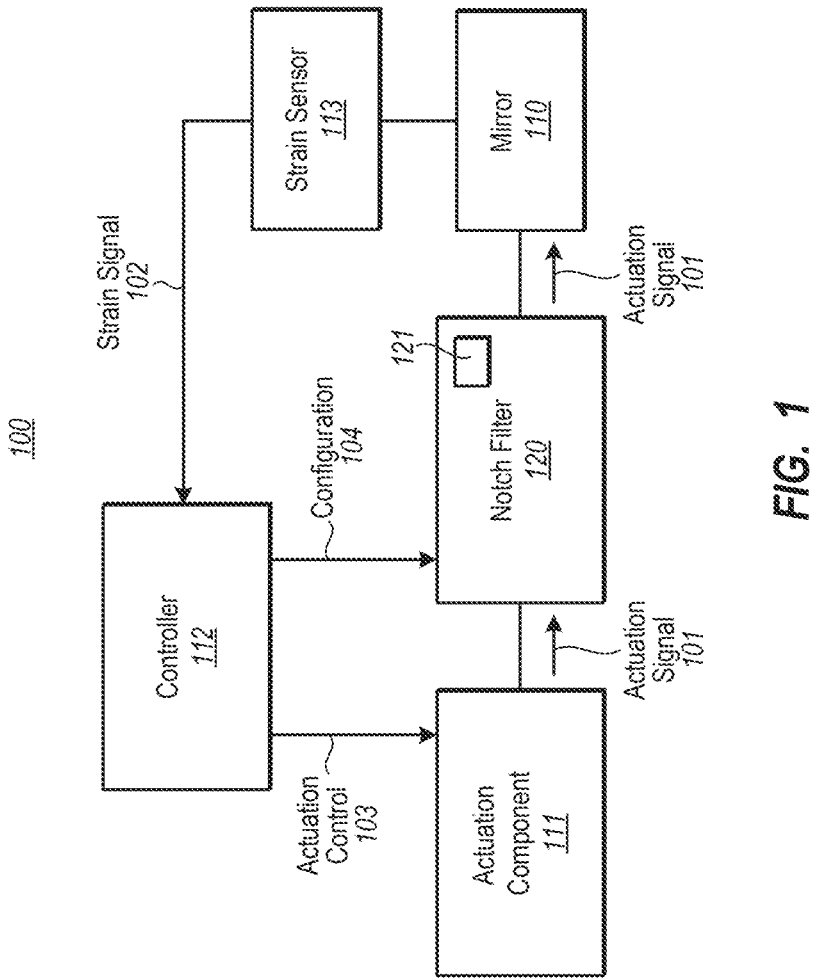
FIG. 1 illustrates an optical system in which the principles described herein may operate, and which includes a micromirror.

FIG. 1 illustrates an optical system 100 in which the principles described herein may operate. The micromirror system 100 includes a micromirror 110, which is a Micro-ElectroMechanical System (MEMS) device that receives as input an actuation signal 101, and which responds to the actuation signal with mechanical movement. The mechanical movement of the micromirror 110 changes a reflectance angle of incident light, thereby contributing to the operation of the optical system 100.

As an example, some optical systems may have two micromirrors that operate together to perform scanning of a laser beam onto a display at high speed to thereby form an image on the display. For example, one micromirror (sometimes called a "fast scan" mirror) performs horizontal scanning, and another micromirror (sometimes called a "slow scan" mirror) performs vertical scanning. However, this is just an example of an optical system that has a micromirror. The principles described herein apply regardless of what system the micromirror operates within.

The micromirror system 100 includes an actuation component 111 that feeds an actuation signal to the micromirror to thereby cause movement of the micromirror 110. Thus, the actuation component 111 is configured to actuate the micromirror 110. The micromirror system 100 also has a notch filter 120 that filters out certain frequencies of the actuation signal 101 to reduce unwanted resonance of the micromirror 110.

In particular, a controller 112 controls the actuation component 111 using the actuation control signal 103 so that the actuation component 111 appropriately causes actuation of the micromirror 110 to thereby advance the function of the optical system 100. The controller 112 also provides a configuration signal 104 to thereby configure the notch filter 120. Thus, the controller 112 functions as a notch filter configuration component. The micromirror system 100 includes a strain sensor 113 that is situated on a surface of a micromirror assembly that experiences strain indicative of (e.g., proportional to) a position of the micromirror 110. This strain sensor may feed a strain signal 102 indicative of that strain back to the controller 112. If the controller 112 is performed on a computing system such as the computing system 800 of FIG. 8, the controller 112 may be structured as described below for the executable component 806 of FIG. 8.

The micromirror has multiple mechanical resonances that depend on the geometry of the micromirror. Sometimes, those resonances may be used to appropriate advantage. For example, a fast scan micromirror can operate under productive resonance. However, sometimes resonances are undesirable and are counterproductive to the micromirror operation.

Take, for example, a slow scan micromirror that functions to control vertical scan of an image. Assume that the optical system displays 90 frames per second. To generate a particular frame, the slow scan mirror will advance the beam from the top of the frame to the bottom of the frame, whilst the fast scan mirror moves the beam horizontally back and forth. To generate a single frame, the slow scan mirror is to move the beam vertically downward at an approximately linear rate. Then, between frames (during a vertical blanking interval where light is not emitted onto the display) the micromirror moves so that subsequent light is then again emitted beginning at the top of the image to begin scanning of the next frame.

Thus, the primary operation frequency of the slow scan mirror is about the frame rate of the image being scanned (in this example—90 Hertz). If there are higher frequency disturbances, this will result in the vertical position of the beam moving quickly above or below the ideal vertical position, which can become noticeable to a user as ripples, bright bands, jitter, or other visual anomalies inconsistent with the original image data, thereby impacting image quality.

Figure 2:
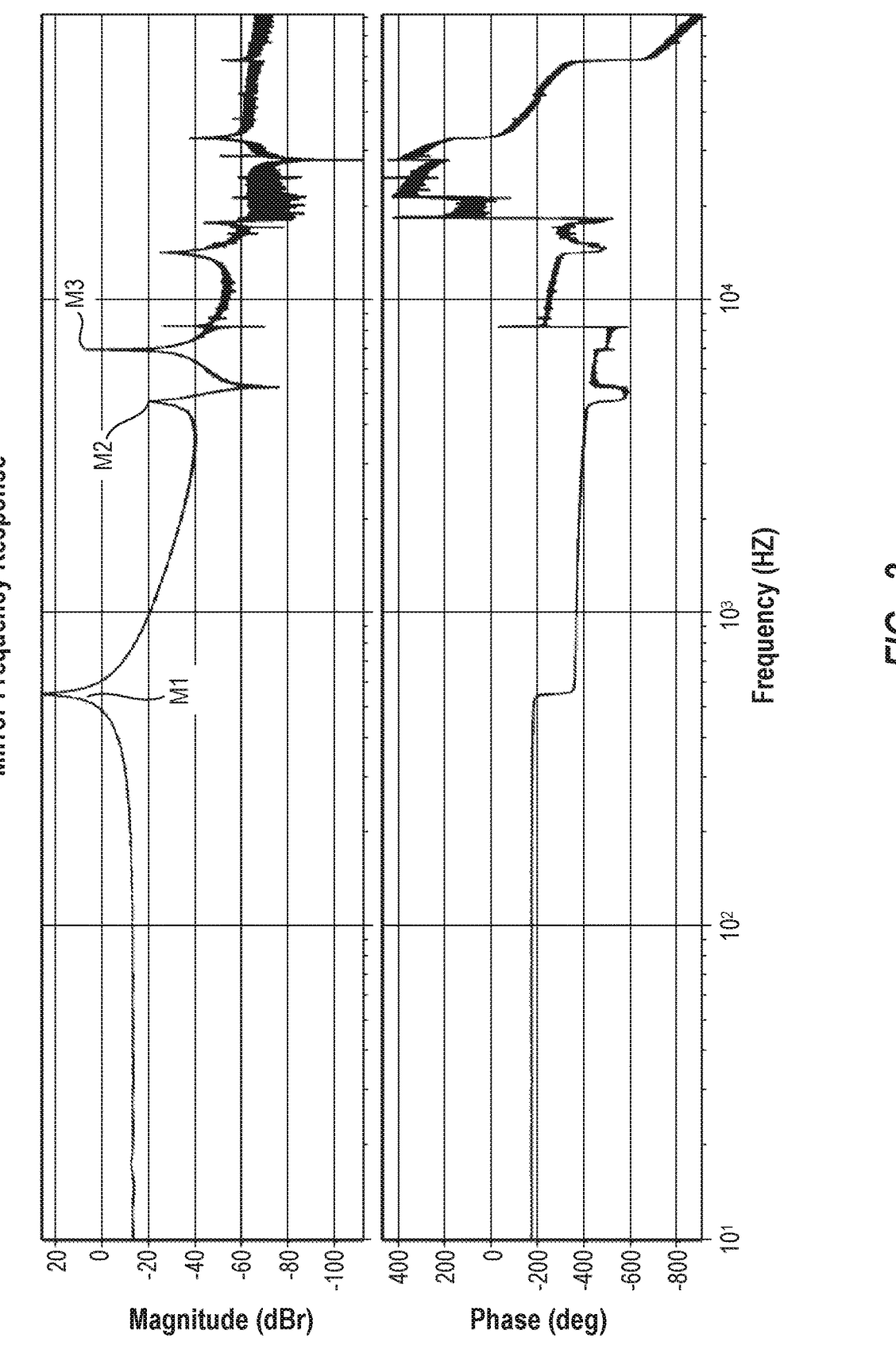
FIG. 2 shows a bode plot that represents a typical frequency response of a slow scan mirror.

However, the slow scan micromirror has various resonances that depend on the geometry of the micromirror. To illustrate this, FIG. 2 shows a bode plot that represents a typical frequency response of a slow scan mirror. The upper half of the bode plot shows the gain as a function of frequency. Note in this example bode plot, there is a first resonance M1, a second resonance M2, a third resonance M3, and some more minor higher frequency references that are not labelled, but which have lower gain and thus are of lesser concern.

The third resonance M3 is concerning, however, since there is positive gain, is of a frequency that impacts image quality, and varies greatly from device to device, and even within a single device with aging of the device and changes in operating temperature of the device. However, the principles described herein are not limited to configuring a notch filter for the third resonance M3 of a micromirror, as the resonance that deviates device to device and during operation may be different depending on the geometry and function of the micromirror.

Figure 3:
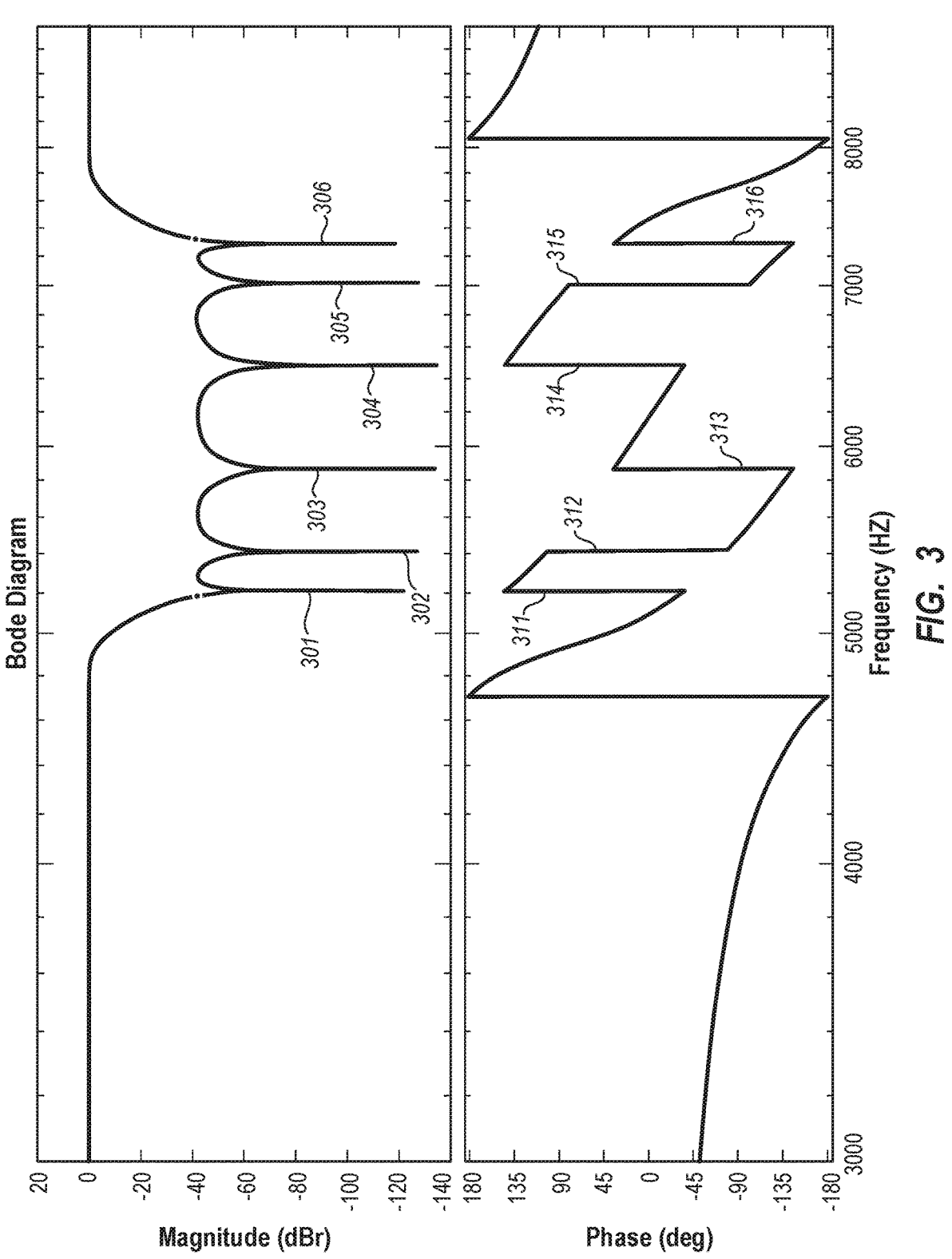
FIG. 3 illustrates an example notch filter bode diagram showing in the upper half gain with respect to frequency, and in the lower half phase with respect to frequency.

Prior to further describing the configuring process of the notch filter, more regarding notch filters and their configuration will now be described. FIG. 3 illustrates an example notch filter bode diagram showing in the upper half gain with respect to frequency, and in the lower half phase with respect to frequency. The transfer function of a notch filter can be written as the product of constituent bi-quads. Thus, if the notch filter contains six bi-quads that have respective bi-quad transfer functions $H_1(z)$, $H_2(z)$, $H_3(z)$, $H_4(z)$, $H_5(z)$ and $H_6(z)$, then the transfer function of the notch filter as a whole is $H(z)=H_1(z)*H_2(z)*H_3(z)*H_4(z)*H_5(z)*H_6(z)$.

FIG. 3 shows six sharp gain drops 301 through 306 where the transfer function of the respective bi-quad becomes dominant. Furthermore, with each drop, there is a respective phase shifts 311 through 316. Introducing more bi-quads will introduce more phase shifts into the activation signal, thereby increasing the delay in the activation. Thus, there is a limit to how wide the notch filter can be made without adversely impacting the actuation control of the micromirror. In this example, in which there are five independent parameters for each bi-quad, and six bi-quads, the notch filter will have a total of 30 independent configuration parameters.

Figure 4:
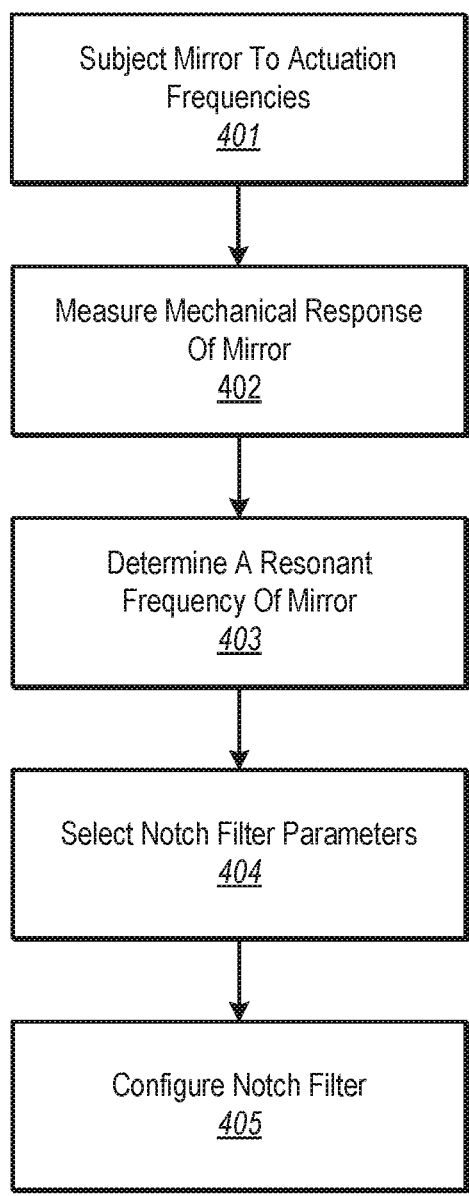
FIG. 4 illustrates a flowchart of a method for configuring actuation of a micromirror to suppress mechanical resonance of the micromirror, in accordance with the principles described herein.

FIG. 4 illustrates a flowchart of a method 400 for configuring actuation of a micromirror to suppress mechanical resonance of the micromirror, in accordance with the principles described herein. The method 400 may, for example, be performed by the controller 112 of FIG. 1. The method 400 includes subjecting the micromirror to a plurality of actuation frequencies (act 401), measuring a mechanical response of the micromirror to at least some of the actuation frequencies (act 402), determining a resonant frequency of the micromirror using at least some of the measured mechanical responses (act 403), and then selecting notch filter parameters of a notch filter through which actuation signals are to be sent to actuate the micromirror (act 404). There is more than one possibility for notch filter parameters, but the selection of the possibility depends on the determined resonant frequency of the micromirror. The notch filter parameters are then applied to the notch filter (act 405).

More regarding each of these acts will be described below. But for now, note that with respect to notch filter configuration to be applied to the notch filter that filters the actuation signal used to drive the micromirror, that the notch filter configuration is determined based on the actual measured resonance experienced by the micromirror. Thus, the notch filter configuration is already tailored to the specific micromirror at whatever age the micromirror was at the time the resonance was measured. Thus, device-to-device differences in micromirrors are addressed, as well as resonance shift due to aging of the micromirror.

Furthermore, the notch filter also addresses micromirror resonance shift due to environmental factors (e.g., temperature), as long as the environmental factors do not change significantly or there is a proper safety factor in the notch filter to account for such environmental deviations. Accordingly, micromirror performance becomes much more robust, suppressing difficult resonance that can change according to device, age and environment.

Returning back to the method 400, the method 400 includes subjecting the micromirror to a plurality of actuation frequencies (act 401). This may be accomplished by sweeping that actuation signal through a range of frequencies that somewhere contains the resonance until the resonance is detected. As an example, suppose that the resonance frequency being addressed lies typically somewhere from say 4.7 kHz to 8.2 kHz (accounting for device-to-device variation, aging, and temperature). A sine wave may be applied beginning at 4.7 kHz with steadily increasing frequency until the resonance is encountered. This sweep technique has the advantage of determining the resonance very accurately. However, it takes time to sweep a sine wave through a range of frequencies since the sweeping should be slow enough that when the resonant frequency is approached, the sweeping stays close enough to that resonant frequency for sufficient time that an actual mechanical resonance may be measured.

As an alternative, the subjecting of the micromirror to a plurality of actuation frequencies (act 401) may be performed by applying a wide frequency noise signal (e.g., a chirp). If the resonance resides within the frequency range of that wide frequency, then the micromirror should begin resonating at its resonant frequency. This approach takes less time to be able to achieve resonance, but also is less accurate.

In another approach, a balance between these advantages may be achieved by using a wide frequency noise signal to quickly narrow in on a smaller frequency range where the resonant frequency is, and then sweeping with the sine wave through that smaller range. This reduces the amount of time to achieve resonance as compared to only doing the sine wave sweep, but has the same accuracy as doing the sine wave sweep.

Returning to the method 400 of FIG. 4, while the frequencies are being applied in the actuation signal to the micromirror (act 401), the mechanical response of the micromirror to at least some of the actuation frequencies is measured (act 402). As an example, a strain sensor (e.g., the strain sensor 113 of FIG. 1) may be positioned with respect to the micromirror such that strain measured by the strain sensor is indicative of (e.g., proportional to) the tilt of the micromirror. Thus, the mechanical response of the micromirror is reflected in the strain signal (i.e., the output signal) from the strain sensor.

From these measurements of the mechanical response, the resonance of the micromirror may be detected (act 403). As an example, if the activation frequencies applied to the micromirror are in the form of a sine wave sweeping through those activation frequencies, the strain signal will have maximum amplitude when the micromirror achieves mechanical resonance. The resonant frequency can then be determined as being whatever frequency that actuator was then applying to the micromirror, or may perhaps be achieved by determining the frequency of the strain signal when that strain signal achieved maximum amplitude.

If the activation frequencies are simultaneously applied using wide frequency noise, then the system can no longer rely upon using whatever frequency was applied as the actuation signal (since there is no single frequency). Instead, the frequency of the strain signal itself is interpreted. The interpretation of the frequency of the strain signal may be a less accurate way of determining a resonant frequency than simply identifying the frequency of the activation signal was when the strain signal amplitude hit a maximum. This is why sine wave sweeping may be a more accurate way to determine the resonant frequency of the micromirror.

After the resonant frequency of the micromirror is determined (act 403), the notch filter parameters of the notch filter are selected (act 404). In one embodiment, the selecting of the notch filter parameters includes calculating the notch filter parameters after determining the resonant frequency of the micromirror. That is, pre-calculated notch filter parameters are not used in this embodiment. This has an advantage in that a notch filter can be configured in which the resonant frequency is in the middle of the suppression frequency range of the notch filter. Alternatively, if runtime deviations in resonance might more likely increase than decrease, the suppression frequency range of the notch filter may be configured so that the measured resonant frequency is in the lower half of the suppression frequency range. On the other hand, if runtime deviations in resonance might more likely decrease than increase, the suppression frequency range of the notch filter may be configured so that the measured resonant frequency is in the upper half of the suppression frequency range.

Stated more generally, the calculation of the notch filter parameters allows for a good fit of the notch filter to the measured frequency range, thereby making it less likely that the resonance will at some nearby time fall outside of the protection of the notch filter. Alternatively, or in addition, the suppression frequency range of the notch filter may be made narrower due to the fit of the suppression frequency range with the measured resonance. This allows the notch filter to use fewer bi-quads, and thus the filter introduces less delay in the actuation signal, which allows for better control of the actuation signal.

One note about this embodiment is that the customization of the notch filter parameters to a particular resonant frequency is computationally intensive. Thus, delaying the computation until the resonance is actually measured may increase the time taken to configure the notch filter. However, this computational time may be reduced if there is convenient access to significant computing resources. As an example, if the optical system has access to network resources (such as a cloud computing environment), the optical system could transmit the measured frequency to a service, which then quickly performs the computations, and transmits the parameters back to the optical system.

Alternatively, the optical system may have access to multiple sets of predetermined notch filter parameters. These multiple sets may even be stored locally. The selecting of the notch filter parameters may then include selecting one of the sets of notch filter parameters. This allows the notch filter parameters to be determined quickly after the resonance is measured.

In an alternative, a hybrid approach may be taken depending on whether the optical system has access to computational resources (e.g., whether the optical system is connected to a cloud computing environment). In that case, if the optical system is offline, then one of the pre-calculated sets of notch filter parameters may be selected. If the optical system is online, then a cloud service may provide custom notch filter parameters calculated using the resonant frequency.

Returning to the method 400, once the notch filter parameters are determined (act 404), the notch filter is configured with these parameters (act 405). As an example, in FIG. 1, the notch filter 120 is illustrated as having parameters 121. The controller 112 supplies the notch filter parameters using configuration signal 104. From that point on, the notch filter 120 suppresses frequencies within the actuation signal 111 that are at or near the resonant frequency of the micromirror. Thus, the mechanical resonance of the micromirror is attenuated or even eliminated.

The principles described herein are not limited to when the method 400 is performed, and how many times the method 400 is performed. As an example, the method 400 might perhaps only be performed once. One example of this is that the method 400 may be performed after the micromirror has been manufactured, but before runtime, or in other words, before the optical system incorporating the micromirror has been shipped to an end user. In this case, the configuring will remove variability in micromirror resonance from device to device.

In one embodiment, the configuration filter configuration of the notch filter are selected such that the notch filter has a suppression frequency range greater than 1500 Hz, which allows for some frequency drift of the resonance in response to post-configuration changes in resonance. However, to avoid too many bi-quads within the notch filter which introduces delay into the control loop, the notch filter is configured to have a suppression frequency range less than 3000 Hz. Thus, in one embodiment, the suppression frequency range of the notch filter is greater than 1500 Hz, but less than 3000 Hz.

As an alternative, or in addition, to performing the method 400 at or just after manufacture of the micromirror, the method 400 may be performed one or more times after the optical system incorporating the micromirror is in possession of an end-user. As an example, the method 400 may be performed each time the optical system is powered up by the end-user, or perhaps every number of times the optical system is powered up, or perhaps after a certain amount of time has passed since the last time the method 400 was performed, upon the next power up of the optical system.

The advantage of performing the method 400 at boot time is that resonance changes due to aging and some resonance changes due to temperature deviations can be taken into account when selecting the configuration of the notch filter. Furthermore, performing the configuring during boot time may be better tolerated by a user since a user typically expects some amount of boot time. Alternatively, or in addition, the method 400 may be performed between boot time perhaps even during a session when the user is actually operating the optical system. This might interrupt a user, but does have an advantage that the method 400 may take more consideration of faster changes in the ambient environment (such as temperature). In one embodiment, the user can initiate a re-performance of the method 400 if the user notices a degradation in output quality of the optical system that incorporates the micromirror system.

Thus, the method 400 may be performed multiple times, resulting in the selected notch filter parameters being different at least some of the times, as aging, temperature, or other influential environmental conditions change.

As previously mentioned, the notch filter parameters may be pre-calculated, in which case there are multiple sets of notch filter parameters. Then, an appropriate set of notch filter parameters are then selected when the actual resonance is measured. One mechanism to do this will now be described.

Figure 5:
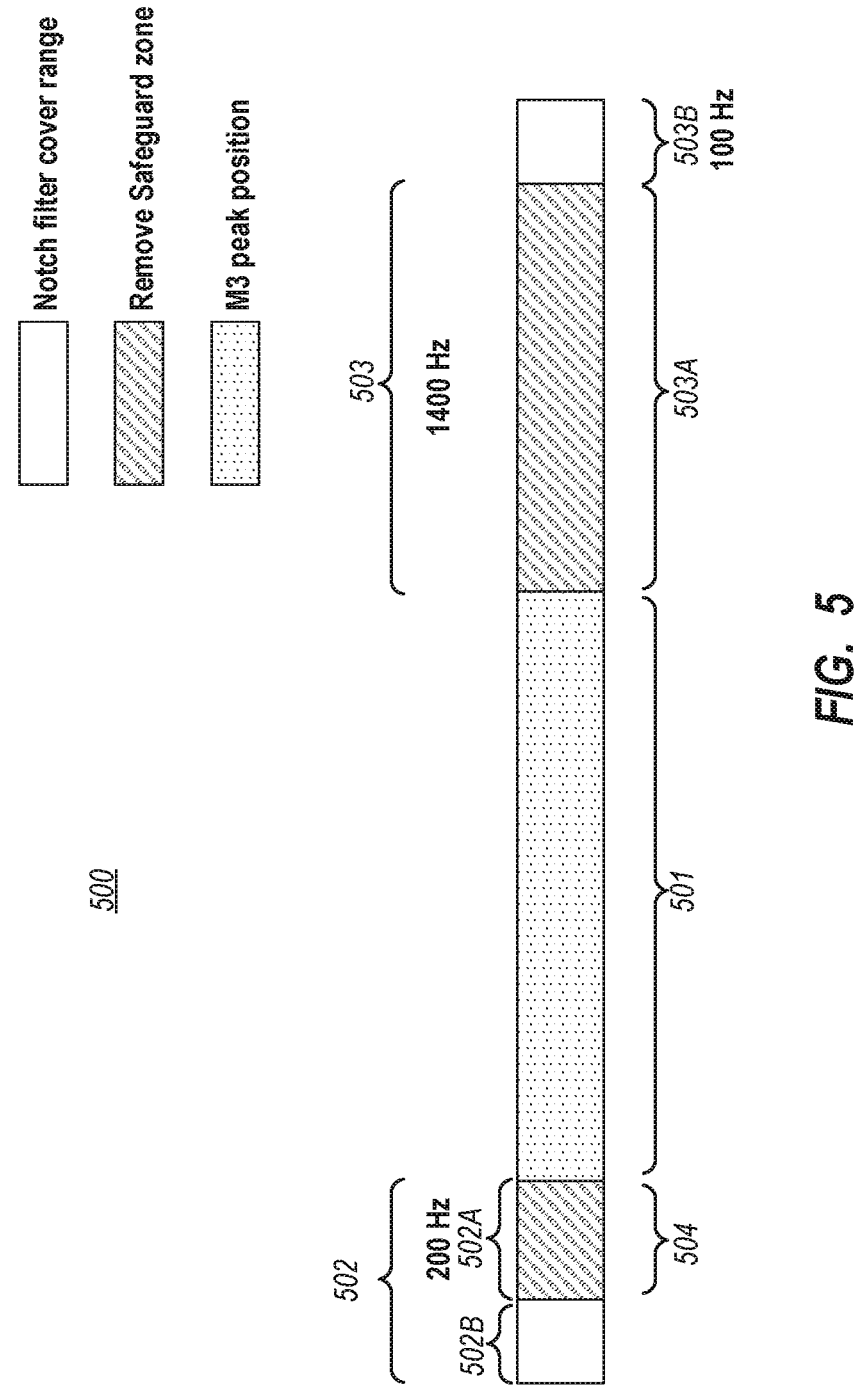
FIG. 5 illustrates an example target suppression frequency range for designing a set of notch filter parameters.

FIG. 5 illustrates a target suppression frequency range 500 for designing a set of notch filter parameters. Lower frequencies are to the left, and higher frequencies are to the right. In the target suppression frequency range 500, there is a central dot-filled region 501. If a measured resonant frequency range measured at room temperature is within the region 501, then the set of notch filter parameters is selected that, when populated into the notch filter, causes the notch filter to have the target suppression frequency range 500. To the left of the region 501 and to the right of the region 501 there is provided some safeguard room.

As an example, the safeguard region 502 to the left of the region 501 includes 300 Hz, where 200 Hz can be allocated to resonant frequency reduction due to temperature change, and where 100 Hz can be allocated to resonant frequency reduction due to aging. Thus, the dashed-lined region 502A can be regarded as a temperature deviation safeguard, and the clear filled region 502B can be regarded as an age deviation safeguard.

Continuing the illustrated example of FIG. 5, the safeguard region 503 to the right of the region 501 includes 1500 Hz, where 1400 Hz can be allocated to resonant frequency increase due to temperature change, and where 100 Hz can be allocated to resonant frequency increase due to aging. Thus, the dashed-lined region 503A can be regarded as another temperature deviation safeguard, and the clear filled region 503B can be regarded as another age deviation safeguard. The size of the safeguard may differ depending on the extent of the frequency range, but FIG. 5 illustrates the general principle.

Figure 6:
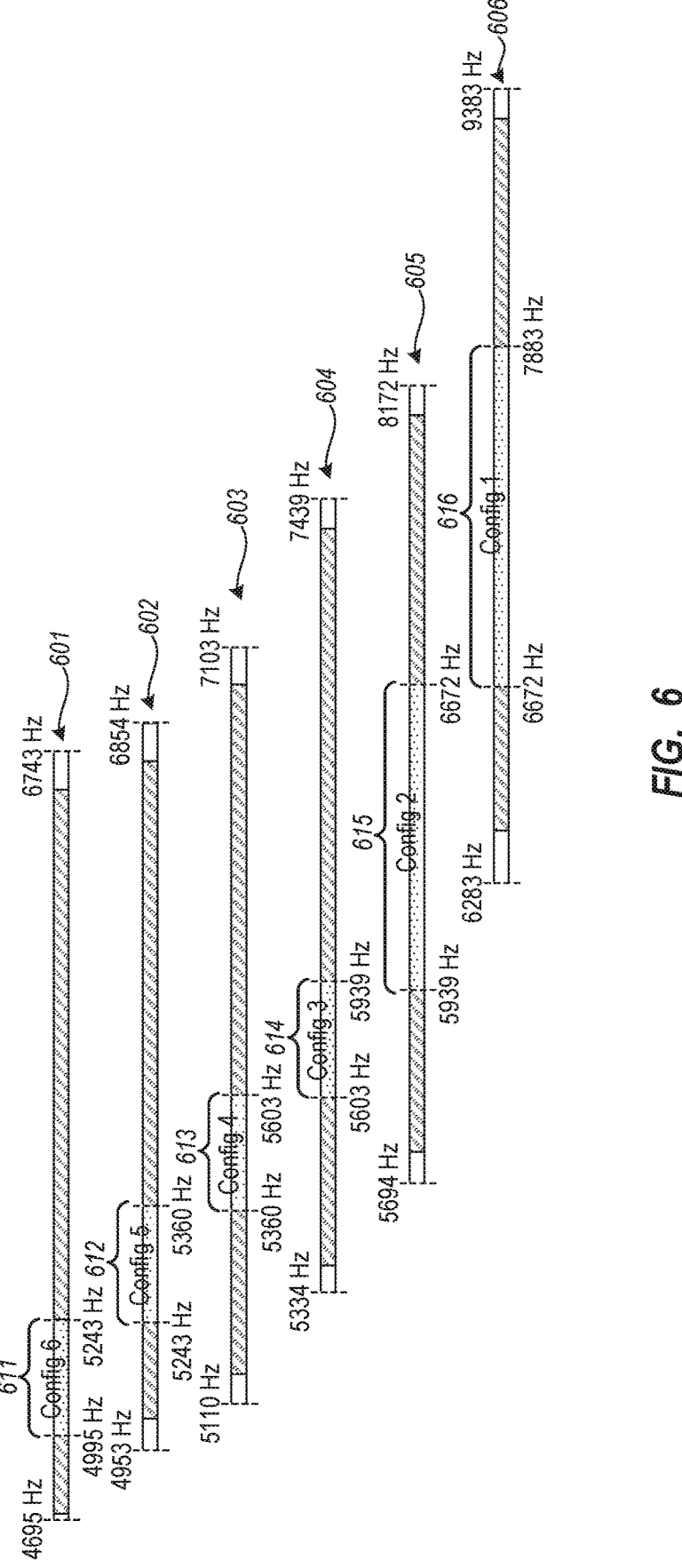
FIG. 6 illustrates an embodiment in which there are six suppression frequency ranges, each overlapping with at least one neighboring suppression frequency range.

In accordance with the principles described herein, a series of notch filter configuration sets are found. FIG. 6 illustrates an embodiment in which there are six suppression frequency ranges, each overlapping with at least one neighboring suppression frequency range. In FIG. 6, for example, there are six suppression frequency ranges 601 through 606, each associated with a notch filter configuration set that when configured into the notch filter, causes the notch filter to have the associated suppression frequency range.

Like FIG. 5, each suppression frequency range 601 through 606 has a respective central region 611 through 616. When a resonance frequency of a micromirror is measured for purposes of selecting a notch filter configuration set, if the measured frequency falls within a central region of a suppression frequency range, the notch filter configuration set associated with that suppression frequency range is selected for configuration into the notch filter.

The notch filter configuration sets are configured such that within a given range (in this case, anywhere from 4995 Hz to 7883 Hz), there will always be a suppression frequency range in which the resonance frequency falls within a central region. In this example, a first notch filter configuration set that enables the first suppression frequency range 601 is selected if the measured resonance frequency of the micromirror falls between 4995 Hz and 5243 Hz, a second notch filter configuration set is selected if the measured resonance frequency falls between 5243 Hz and 5360 Hz, a third notch filter configuration set if between 5360 Hz and 5603 Hz, a fourth notch filter configuration set if between 5603 Hz and 5939 Hz, a fifth notch filter configuration set if between 5939 Hz and 6672 Hz, and a sixth notch filter configuration set if between 6672 Hz and 7883 Hz. This is just an example. The broader principle is that within a given frequency range, the measured resonant frequency will determine which configuration set to select.

An example of how the suppression frequency ranges and associated notch filter configuration sets are determined will now be described, which allows for a small number of configuration sets to be used for a given frequency range. In this method, the highest frequency $f_{high}$ for which it is realistic to have a room temperature micromirror resonant frequency is defined. In this example, that frequency is 7883 Hz.

Now, to define the highest frequency suppression frequency range (which is suppression frequency range 606) in this example, 1500 Hz is added to define the upper limit of the highest frequency suppression frequency range 606. Thus, the highest frequency of the highest frequency suppression frequency range is 9383 Hz. This allows for a bad case scenario where the highest realistic resonant frequency 7883 Hz was measured at room temperature, but the micromirror experiences temperatures and/or aging that increases that resonance frequency within 1500 Hz. If that bad case scenario happens, the notch filter configured with the sixth notch filter configuration set would still attenuate the resonance of the micromirror.

Then, keeping this frequency 9383 Hz as the highest end of the suppression frequency range of the notch filter, the configuration of the notch filter is gradually changed so as to reduce the lower end of the suppression frequency range until it is detected that the optical system performance drops below some acceptable threshold. In this example, the lower limit of the highest frequency range 606 was dropped until an appropriate lower limit (here 6283 Hz) is determined, which is just prior to where the notch filter performance dropped. This drop may be, for example, due to too much delay within the notch filter, thereby adversely impacting the control loop, to thereby degrade the performance of the optical system.

Then, the appropriate central region of the highest frequency range is determined by including a high safeguard region and a low safeguard region. The high safeguard region is in this range 1500 Hz, and the low safeguard region in this range is 389 Hz. The appropriate size of these safeguard regions may be empirically determined by subjecting micromirrors to temperature deviations and aging, to discover realistic amounts of resonance drift (both upwards and downwards) that can reasonably be expected in the respective frequency range.

The lower frequency in the central region of the highest suppression frequency range is then treated as $f_{high}$ for the next highest suppression frequency range. The lower frequency in the central region 616 of the frequency range 606 is 6672 Hz, and thus the highest frequency end of the fifth suppression frequency range 605 is 8172. This process repeats to thereby identify the suppression frequency ranges 606, 605, 604, 603, 602 and 601 in that order, until the central region hits the lowest realistic frequency that may be experienced by a micromirror at room temperature (in this case 4995 Hz). Larger realistic resonant frequency ranges at room temperature may result in a higher number of sets of notch filter configuration. Lower realistic resonant frequency ranges at room temperature may result in a lower number of sets of notch filter configuration.

The suppression frequency ranges of FIG. 6 is just an example. In one example, the notch filter configuration settings are selected in a way that the suppression frequency ranges are greater than 1500 Hz (to ensure a safeguard around the central region), but less than 3000 Hz (to ensure no control loop problems).

To ensure that there will always be a central region of a suppression frequency range in which a measured resonant frequency falls, there is significant overlap between neighboring suppression frequency ranges. In one embodiment, the notch filter configuration sets are configured to overlap with neighboring notch filter configuration sets by at least 500 Hz, and perhaps by at least 1500 Hz.

Figure 7:
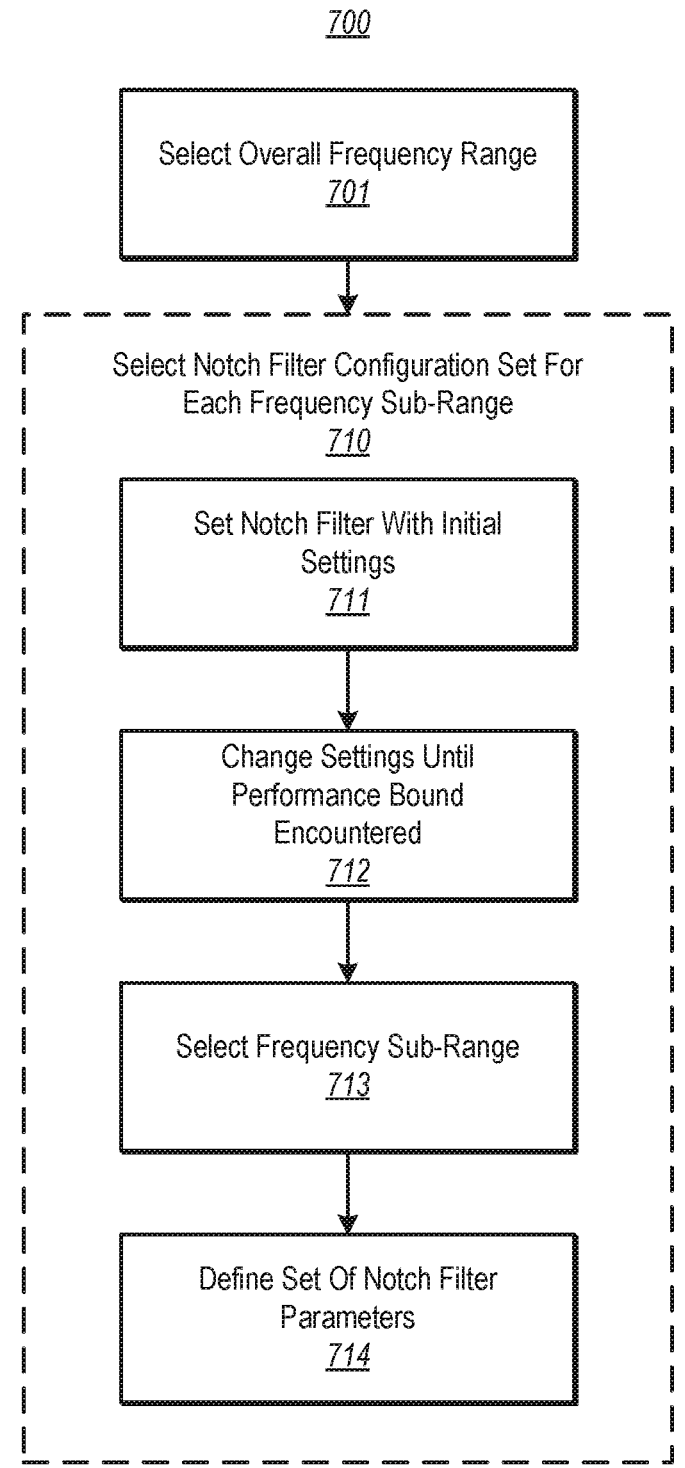
FIG. 7 illustrates a more general method for generating a plurality of sets of notch filter configurations for filtering actuation signals for micromirrors, in accordance with the principles described herein.

FIG. 7 illustrates a more general method 700 for generating a plurality of sets of notch filter configurations for filtering actuation signals for micromirrors, in accordance with the principles described herein. In the method 700, a system selects an overall frequency range that is to be subject to potential suppression of an actuation signal for a notch filter (act 701). For each of multiple frequency subranges that are within the selected overall frequency range, the content of box 710 is performing to select a corresponding set of notch filter configuration settings.

That is, a test notch filter is set with an initial configuration setting such that the test notch filter has an initial suppression filter range (act 711). Then, beginning from the initial suppression filter range, the system repeats an act of changing the configuration setting of the test notch filter so that the suppression filter range expands until a bound of the sub-frequency range is found prior to performance of the test notch filter dropping below a predetermined threshold, or until a bound of the overall frequency range is encountered (act 712). The frequency sub-range is selected (act 713) as having this bound as one bound of the frequency sub range. The other bound of the frequency sub-range is either a bound of the overall frequency range, or an opposite bound of the sub-frequency range prior to performance of the test notch filter dropping below the predetermined threshold. The corresponding set of notch filter configuration settings are then defined for that frequency sub-range (act 714).

Because the principles described herein are performed in the context of a computing system, some introductory discussion of a computing system will be described with respect to FIG. 8. Computing systems are now increasingly taking a wide variety of forms. Computing systems may, for example, be handheld devices, appliances, laptop computers, desktop computers, mainframes, distributed computing systems, data centers, or even devices that have not conventionally been considered a computing system, such as wearables (e.g., glasses). In this description and in the claims, the term "computing system" is defined broadly as including any device or system (or a combination thereof) that includes at least one physical and tangible processor, and a physical and tangible memory capable of having thereon computer-executable instructions that may be executed by a processor. The memory may take any form and may depend on the nature and form of the computing system. A computing system may be distributed over a network environment and may include multiple constituent computing systems.

Figure 8:
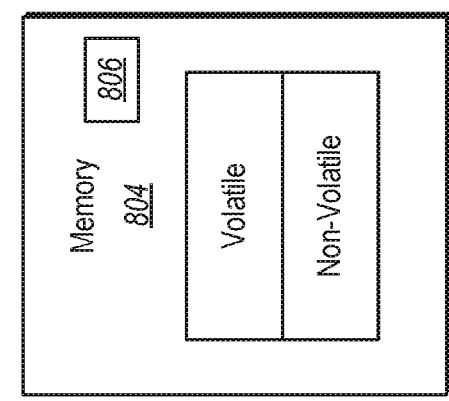
FIG. 8 illustrates a computing system in which embodiments described herein may be employed.

As illustrated in FIG. 8, in its most basic configuration, a computing system 800 includes at least one hardware processing unit 802 and memory 804. The processing unit 802 includes a general-purpose processor. Although not required, the processing unit 802 may also include a field programmable gate array (FPGA), an application specific integrated circuit (ASIC), or any other specialized circuit. In one embodiment, the memory 804 includes a physical system memory. That physical system memory may be volatile, non-volatile, or some combination of the two. In a second embodiment, the memory is non-volatile mass storage such as physical storage media. If the computing system is distributed, the processing, memory and/or storage capability may be distributed as well.

The computing system 800 also has thereon multiple structures often referred to as an "executable component". For instance, the memory 804 of the computing system 800 is illustrated as including executable component 806. The term "executable component" is the name for a structure that is well understood to one of ordinary skill in the art in the field of computing as being a structure that can be software, hardware, or a combination thereof. For instance, when implemented in software, one of ordinary skill in the art would understand that the structure of an executable component may include software objects, routines, methods (and so forth) that may be executed on the computing system. Such an executable component exists in the heap of a computing system, in computer-readable storage media, or a combination.

One of ordinary skill in the art will recognize that the structure of the executable component exists on a computer-readable medium such that, when interpreted by one or more processors of a computing system (e.g., by a processor thread), the computing system is caused to perform a function. Such structure may be computer readable directly by the processors (as is the case if the executable component were binary). Alternatively, the structure may be structured to be interpretable and/or compiled (whether in a single stage or in multiple stages) so as to generate such binary that is directly interpretable by the processors. Such an understanding of example structures of an executable component is well within the understanding of one of ordinary skill in the art of computing when using the term "executable component".

The term "executable component" is also well understood by one of ordinary skill as including structures, such as hard coded or hard wired logic gates, that are implemented exclusively or near-exclusively in hardware, such as within a field programmable gate array (FPGA), an application specific integrated circuit (ASIC), or any other specialized circuit. Accordingly, the term "executable component" is a term for a structure that is well understood by those of ordinary skill in the art of computing, whether implemented in software, hardware, or a combination. In this description, the terms "component", "agent", "manager", "service", "engine", "module", "virtual machine" or the like may also be used. As used in this description and in the case, these terms (whether expressed with or without a modifying clause) are also intended to be synonymous with the term "executable component", and thus also have a structure that is well understood by those of ordinary skill in the art of computing.

In the description that follows, embodiments are described with reference to acts that are performed by one or more computing systems. If such acts are implemented in software, one or more processors (of the associated computing system that performs the act) direct the operation of the computing system in response to having executed computer-executable instructions that constitute an executable component. For example, such computer-executable instructions may be embodied on one or more computer-readable media that form a computer program product. An example of such an operation involves the manipulation of data. If such acts are implemented exclusively or near-exclusively in hardware, such as within a FPGA or an ASIC, the computer-executable instructions may be hard-coded or hard-wired logic gates. The computer-executable instructions (and the manipulated data) may be stored in the memory 804 of the computing system 800. Computing system 800 may also contain communication channels 808 that allow the computing system 800 to communicate with other computing systems over, for example, network 810.

While not all computing systems require a user interface, in some embodiments, the computing system 800 includes a user interface system 812 for use in interfacing with a user. The user interface system 812 may include output mechanisms 812A as well as input mechanisms 812B. The principles described herein are not limited to the precise output mechanisms 812A or input mechanisms 812B as such will depend on the nature of the device. However, output mechanisms 812A might include, for instance, speakers, displays, tactile output, virtual or augmented reality, holograms and so forth. Examples of input mechanisms 812B might include, for instance, microphones, touchscreens, virtual or augmented reality, holograms, cameras, keyboards, mouse or other pointer input, sensors of any type, and so forth.

Embodiments described herein may comprise or utilize a special-purpose or general-purpose computing system including computer hardware, such as, for example, one or more processors and system memory, as discussed in greater detail below. Embodiments described herein also include physical and other computer-readable media for carrying or storing computer-executable instructions and/or data structures. Such computer-readable media can be any available media that can be accessed by a general-purpose or special-purpose computing system. Computer-readable media that store computer-executable instructions are physical storage media. Computer-readable media that carry computer-executable instructions are transmission media. Thus, by way of example, and not limitation, embodiments of the invention can comprise at least two distinctly different kinds of computer-readable media: storage media and transmission media.

Computer-readable storage media includes RAM, ROM, EEPROM, CD-ROM, or other optical disk storage, magnetic disk storage, or other magnetic storage devices, or any other physical and tangible storage medium which can be used to store desired program code means in the form of computer-executable instructions or data structures and which can be accessed by a general-purpose or special-purpose computing system.

A "network" is defined as one or more data links that enable the transport of electronic data between computing systems and/or modules and/or other electronic devices. When information is transferred or provided over a network or another communications connection (either hardwired, wireless, or a combination of hardwired or wireless) to a computing system, the computing system properly views the connection as a transmission medium. Transmission media can include a network and/or data links which can be used to carry desired program code means in the form of computer-executable instructions or data structures and which can be accessed by a general-purpose or special-purpose computing system. Combinations of the above should also be included within the scope of computer-readable media.

Further, upon reaching various computing system components, program code means in the form of computer-executable instructions or data structures can be transferred automatically from transmission media to storage media (or vice versa). For example, computer-executable instructions or data structures received over a network or data link can be buffered in RAM within a network interface module (e.g., a "NIC"), and then be eventually transferred to computing system RAM and/or to less volatile storage media at a computing system. Thus, it should be understood that storage media can be included in computing system components that also (or even primarily) utilize transmission media.

Computer-executable instructions comprise, for example, instructions and data which, when executed at a processor, cause a general-purpose computing system, special-purpose computing system, or special-purpose processing device to perform a certain function or group of functions. Alternatively, or in addition, the computer-executable instructions may configure the computing system to perform a certain function or group of functions. The computer executable instructions may be, for example, binaries or even instructions that undergo some translation (such as compilation) before direct execution by the processors, such as intermediate format instructions such as assembly language, or even source code.

Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the invention may be practiced in network computing environments with many types of computing system configurations, including, personal computers, desktop computers, laptop computers, message processors, hand-held devices, multi-processor systems, microprocessor-based or programmable consumer electronics, network PCs, minicomputers, mainframe computers, mobile telephones, PDAs, pagers, routers, switches, datacenters, wearables (such as glasses) and the like. The invention may also be practiced in distributed system environments where local and remote computing system, which are linked (either by hardwired data links, wireless data links, or by a combination of hardwired and wireless data links) through a network, both perform tasks. In a distributed system environment, program modules may be located in both local and remote memory storage devices.

Those skilled in the art will also appreciate that the invention may be practiced in a cloud computing environment. Cloud computing environments may be distributed, although this is not required. When distributed, cloud computing environments may be distributed internationally within an organization and/or have components possessed across multiple organizations. In this description and the following claims, "cloud computing" is defined as a model for enabling on-demand network access to a shared pool of configurable computing resources (e.g., networks, servers, storage, applications, and services). The definition of "cloud computing" is not limited to any of the other numerous advantages that can be obtained from such a model when properly deployed.

For the processes and methods disclosed herein, the operations performed in the processes and methods may be implemented in differing order. Furthermore, the outlined operations are only provided as examples, and some of the operations may be optional, combined into fewer steps and operations, supplemented with further operations, or expanded into additional operations without detracting from the essence of the disclosed embodiments.

The present invention may be embodied in other specific forms without departing from its spirit or characteristics. The described embodiments are to be considered in all respects only as illustrative and not restrictive. The scope of the invention is, therefore, indicate by the appended claims rather than by the foregoing description. All changes which come within the meaning and range of equivalency of the claims are to be embraced within their scope.

What is claimed is:

1. A method for configuring actuation of a micromirror to suppress mechanical resonance of the micromirror, the method comprising:

subjecting the micromirror to a first plurality of actuation frequencies, wherein the first plurality of actuation frequencies comprises at least a chirp;

measuring a mechanical response of the micromirror to at least some of the first plurality of actuation frequencies;

determining a second plurality of actuation frequencies, wherein the second plurality of actuation frequencies comprises a smaller frequency range determined based on the mechanical response of the micromirror to the chirp;

measuring a mechanical response of the micromirror to the second plurality of actuation frequencies;

determining a resonant frequency of the micromirror using the mechanical response of the micromirror to the second plurality of actuation frequencies determined based on the mechanical response of the micromirror to the chirp;

selecting notch filter parameters of a notch filter that is structured to filter actuation signals of the micromirror, the selection depending on the determined resonant frequency; and configuring the notch filter with the selected notch filter parameters.

2. The method for configuring actuation of a micromirror to suppress mechanical resonance of the micromirror in accordance with claim 1, the notch filter configured to have a suppression frequency range greater than 1500 Hz, but less than 3000 Hz, when configured with the selected notch filter parameters.

3. The method for configuring actuation of a micromirror to suppress mechanical resonance of the micromirror in accordance with claim 1, a plurality of sets of notch filter parameters having been predetermined, the selecting of the notch filter parameters comprising selecting one set of the plurality of sets of notch filter parameters.

4. The method for configuring actuation of a micromirror to suppress mechanical resonance of the micromirror in accordance with claim 3, each of the plurality of sets of notch filter parameters causing the notch filter to have a suppression frequency range greater than 1500 Hz, but less than 3000 Hz.

5. The method for configuring actuation of a micromirror to suppress mechanical resonance of the micromirror in accordance with claim 3, each of the plurality of sets of notch filter parameters causing the notch filter to have a suppression frequency range that overlaps with a neighboring suppression frequency range.

6. The method for configuring actuation of a micromirror to suppress mechanical resonance of the micromirror in accordance with claim 5, each of the plurality of sets of notch filter parameters causing the notch filter to have a suppression frequency range that overlaps with a neighboring suppression frequency range by at least 500 Hz.

7. The method for configuring actuation of a micromirror to suppress mechanical resonance of the micromirror in accordance with claim 5, each of the plurality of sets of notch filter parameters causing the notch filter to have a suppression frequency range that overlaps with a neighboring suppression frequency range by at least 1500 Hz.

8. The method for configuring actuation of a micromirror to suppress mechanical resonance of the micromirror in accordance with claim 1, the selecting of the notch filter parameters comprising calculating the notch filter parameters after determining the resonant frequency of the micromirror.

9. The method for configuring actuation of a micromirror to suppress mechanical resonance of the micromirror in accordance with claim 1, the method performed after the micromirror has been manufactured, but before runtime.

10. The method for configuring actuation of a micromirror to suppress mechanical resonance of the micromirror in accordance with claim 1, the method being performed during power up of the micromirror by a user of the micromirror.

11. The method for configuring actuation of a micromirror to suppress mechanical resonance of the micromirror in accordance with claim 1, the method being performed a plurality of times, the selected notch filter parameters being different for at least one of the plurality of times.

12. The method for configuring actuation of a micromirror to suppress mechanical resonance of the micromirror in accordance with claim 11, at least one of the plurality of times occurring at or after the micromirror has been manufactured but before runtime, at least one of the plurality of times performed in response to user activity with respect to the micromirror.

13. The method for configuring actuation of a micromirror to suppress mechanical resonance of the micromirror in accordance with claim 1, the method being performed during operation of the micromirror by a user of the micromirror.

14. The method in accordance with claim 1, the micromirror being a slow scan mirror of a laser bean scanning display having a fast scan mirror and the slow scan mirror.

15. An optical system comprising:

a micromirror;

an actuation component configured to actuate the micromirror;

a notch filter configured to suppress frequencies in an actuation signal generated by the actuation component within a target suppression frequency range that depends on configuration of the notch filter; and a notch filter configuration component that is configured to configure actuation of a micromirror to suppress mechanical resonance of the micromirror, by being configured to perform the following:

subjecting the micromirror to a first plurality of actuation frequencies, wherein the first plurality of actuation frequencies comprises at least a chirp;

measuring a mechanical response of the micromirror to the first plurality of actuation frequencies;

determining a second plurality of actuation frequencies, wherein the second plurality of actuation frequencies comprises a smaller frequency range determined based on the mechanical response of the micromirror to the chirp;

measuring a mechanical response of the micromirror to the second plurality of actuation frequencies;

determining a resonant frequency of the micromirror using the mechanical response of the micromirror to the second plurality of actuation frequencies determined based on the mechanical response of the micromirror to the chirp;

selecting notch filter parameters of a notch filter configured to filter actuation signals of the micromirror, the selection depending on the determined resonant frequency of the micromirror; and configuring the notch filter with the selected notch filter parameters.

16. The optical system in accordance with claim 15, the notch filter configured to have a suppression frequency range greater than 1500 Hz, but less than 3000 Hz, when configured with the selected notch filter parameters.

17. The optical system in accordance with claim 15, a plurality of sets of notch filter parameters having been predetermined, the selecting of the notch filter parameters comprising selecting one set of the plurality of sets of notch filter parameters.

18. The optical system in accordance with claim 15, the micromirror being a slow scan mirror of a laser beam scanning display, the optical system also comprising a fast scan mirror.

19. The optical system in accordance with claim 15, the notch filter configuration component structured to perform the configuration at least some of the times that the optical system is powered up.

20. The optical system in accordance with claim 15, the notch filter configuration component structured to perform the configuration a plurality of times and not limited to select the same notch filter parameters each of the plurality of times.

\* \* \* \* \*